US 6,993,055 B2

(12) United States Patent
Wang et al.

(10) Patent No.: US 6,993,055 B2
(45) Date of Patent: Jan. 31, 2006

(54) RESONANT CAVITY DEVICE ARRAY FOR WDM APPLICATION AND THE FABRICATION METHOD OF THE SAME

(75) Inventors: Jyh-Shyang Wang, Taoyuan (TW); Yi-Tsuo Wu, Taipei (TW); Nikolai A. Maleev, Hsinchu (TW); Alexey V. Sakharov, Hsinchu (TW); Alexey R. Kovsh, Hsinchu (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 158 days.

(21) Appl. No.: 10/395,240

(22) Filed: Mar. 25, 2003

(65) Prior Publication Data

US 2004/0114645 A1  Jun. 17, 2004

(30) Foreign Application Priority Data

Dec. 13, 2002  (TW) ................ 91136182 A

(51) Int. Cl.
 *H01S 5/00* (2006.01)
(52) U.S. Cl. .................. 372/46.013; 372/50.12; 372/50.121; 372/50.124
(58) Field of Classification Search .......... 372/45, 372/46, 68, 50, 45.01, 46.01, 46.013, 50.12, 372/50.121, 50.124
See application file for complete search history.

(56) References Cited

U.S. PATENT DOCUMENTS

| 5,719,891 | A | * | 2/1998 | Jewell | 372/45 |
| 5,985,686 | A | * | 11/1999 | Jayaraman | 438/32 |
| 6,117,699 | A |   | 9/2000 | Lemoff et al. | 438/35 |
| 6,174,749 | B1 |  | 1/2001 | Yuen et al. | 438/35 |
| 6,795,457 | B2 | * | 9/2004 | Song et al. | 372/23 |
| 2001/0050934 | A1 | * | 12/2001 | Choquette et al. | 372/43 |

* cited by examiner

*Primary Examiner*—Minsun Oh Harvey
*Assistant Examiner*—James Menefee
(74) *Attorney, Agent, or Firm*—Birch, Stewart, Kolasch & Birch, LLP

(57) ABSTRACT

The specification discloses a resonant cavity device array for wavelength division multiplexing and the method for fabricating it. The structure of the resonant cavity device is selectively formed with an oxide structure, which contains more than one $Al_xGa_{1-x}As$ oxide tuning layer. After the oxidation of AlGaAs, AlGaO is formed to change the refractive index and the thickness, thereby changing and controlling the wavelength of the resonant cavity device. The wavelength variant of each resonant cavity device is determined by the number of layers, thicknesses and compositions of the $Al_xGa_{1-x}As$ oxide tuning layer contained in the selective oxide structure.

9 Claims, 1 Drawing Sheet

RESONANT CAVITY DEVICE ARRAY FOR WDM APPLICATION AND THE FABRICATION METHOD OF THE SAME

BACKGROUND OF THE INVENTION

1. Field of Invention

The invention relates to a resonant cavity device array and the method for making the same. In particular, it relates to a resonant cavity device array for wavelength division multiplexing (WDM) application and the corresponding fabricating method.

2. Related Art

As the internet and multimedia become popular, the need for a wider network bandwidth become more urgent. Optical communication technology plays an important role in future information transmissions. In particular, WDM is one of the best ways for increasing the optic fiber communication bandwidth and the transmission capacity. Several wavelengths are used on a single optic fiber. Different data signals are transmitted using the associated but distinctive wavelengths. The signals are converted by a wavelength division multiplexer into a single optical beam traveling on an optic fiber. Therefore, data signals from different sources are packed and transmitted on a single optic fiber, thereby increasing the efficiency of the bandwidth on the optic fiber.

Take a complete high-density WDM system as an example, it contains an optical transceiver module, a wavelength multiplexer/de-multiplexer, an EDFA, a wavelength extraction multiplexer, a dispersion compensator, a filter, an optical switch router, along with optical communication devices, processing circuits, and a structural optical system. However, the system with a multiple-wavelength optical transceiver module is both expensive and difficult in manufacturing. Since the vertical resonant cavity device (RCD) has the properties of being easy to change in the resonant wavelength and having a good coupling with the optic fiber, it would be a good solution to use RCD array as the optical transceiver module of the WDM system. Nevertheless, how to make several resonant cavities with different wavelengths on a single substrate is currently a problem in the field.

In the U.S. Pat. No. 6,174,749, a polycrystalline pattern is first formed on a substrate. One then controls the growth rate in different areas to form several resonant cavities, achieving the effect of multiple wavelengths. However, this method is not only difficult in controlling, the quality of the epi-layers formed on the substrate is also worse. Another example is the U.S. Pat. No. 6,117,699, which uses the selective etching method to form resonant cavities with different thicknesses before growing the distributed Bragg reflector (DBR). Afterwards, the DBR is formed through a regrowth process. Nonetheless, the depth etched using this method cannot be accurately controlled.

SUMMARY OF THE INVENTION

In view of the foregoing, the invention provides a resonant cavity device array for WDM application and the fabrication method of the same. After oxidation, AlGaAs forms AlGaO to change the refractive index and the thickness. The AlGaAs layer in the resonant cavity device array is selectively oxidized through the uses of devices and the design of the manufacturing process. This changes and controls the allowed wavelength in the oxidation-confined resonant cavity devices.

The invention forms a selective oxidation structure in the structure of a resonant cavity device. It contains more than one $Al_xGa_{1-x}As$ oxidation tuning layer. During the oxidation process, part of the $Al_xGa_{1-x}As$ in the tuning layer is oxidized into AlGaO. The refractive index and thickness of part of the $Al_xGa_{1-x}As$ oxidation tuning layer are changed. As the selective oxidation extent of the $Al_xGa_{1-x}As$ oxidation tuning layer in each resonant cavity device differs from another, therefore the invention can achieve the goal of changing the resonant wavelengths of individual resonant cavity devices. In particular, the selective oxidation structure can be an upper mesa of different sizes formed on each resonant cavity device. The upper mesa contains more than one $Al_xGa_{1-x}As$ oxidation tuning layer. At the same time, the wavelength variant of each resonant cavity device is determined by the number of layers, thicknesses, and compositions of the $Al_xGa_{1-x}As$ oxidation tuning layers contained in the selective oxidation structure.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
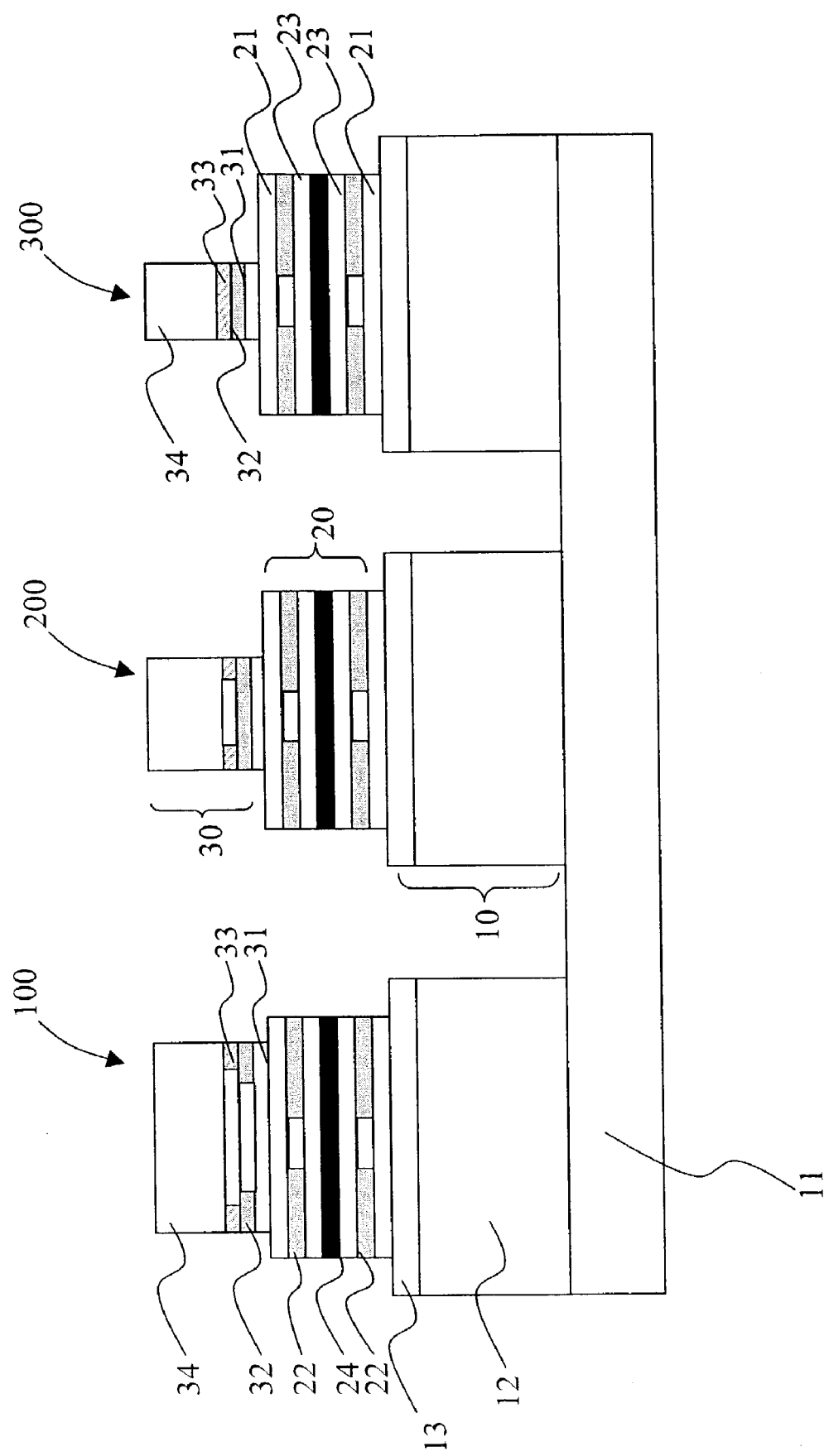
FIG. 1 is a schematic view of the array structure of devices with three wavelengths.

The disclosed resonant cavity device array for WDM application and the fabrication method of the same use the structure and experiment design to determine the resonant wavelength of each resonant cavity device. We use a vertical-cavity surface emitting laser (VCSEL) array in an embodiment to explain the invention. With reference to FIG. 1, devices with three different wavelengths are built on a GaAs substrate 11. Each device is comprised of the upper, middle, and lower mesas. The lower mesa 10 is the same in each of the devices and the middle mesa 20 is the same in each of the devices. From the bottom up, the lower mesa 10 is formed by depositing a bottom distributed Bragg reflector (DBR) 12 and a bottom contact 13 on the GaAs substrate 11.

The middle mesa 20 is a sandwich structure with the active region 23, 24 sandwiched between a symmetric current confined $Al_{0.98}Ga_{0.02}As$ oxide layer 22. From the bottom up, the middle mesa 20 is formed by depositing the bottom contact 21, the current confined $Al_{0.98}Ga_{0.02}As$ oxide layer 22, the active region 23, 24, and the current confined $Al_{0.98}Ga_{0.02}As$ oxide layer 22. Finally, the structure is covered by a top contact 21. The resonant wavelength of each device is determined by the upper mesa 30. The upper mesa 30 is formed by depositing two layers of $Al_xGa_{1-x}As$ with different aluminum concentrations on top of a contact layer 31 as a first tuning layer 32 and a second tuning layer 33. The value of X in $Al_xGa_{1-x}As$ of the first tuning layer 32 is smaller than 0.98, while the aluminum content in the second tuning layer is even smaller. The oxidation rate also becomes smaller as the aluminum content gets lower. Finally, a top DBR 34 is formed above the above-mentioned structure. The oxidation rate of the first tuning layer 32 is 15 $\mu$m/hr and that of the second tuning layer 33 is 10 $\mu$m/hr.

As shown in FIG. 1, the devices with three different resonant wavelengths are the first VCSEL 100, the second VCSEL 200, and the third VCSEL 300. The diameter of the lower mesa 10 in each device is 90 $\mu$m, that of the middle mesa 20 is 65 $\mu$m, and that of the third mesa 30 is used to determine the resonant wavelength of each device. The first VCSEL 100 has a diameter of 40 μm, the second VCSEL 200 has a diameter of 30 μm, and the third VCSEL 300 has a diameter of 20 μm. The wavelength of each VCSEL is determined by the tuning layer contained in the upper mesa 30, i.e. the configuration and oxidation of the $Al_xGa_{1-x}As$ oxide layer. After oxidizing the array structure with these three devices for one hour, the oxidation rate of the current-confined layer 22 is 30 μm/hr. The current-confined aperture formed by oxidizing the current-confined layer 22 in each middle mesa is 5 μm.

The oxidation rate of the first tuning layer 32 is 15 μm/hr, and that of the second tuning layer 33 is 10 μm/hr. As shown in FIG. 1, the border of the first tuning layer 32 of each VCSEL has a 15 μm oxidation area, while that of the second tuning layer 33 of each VCSEL has a 10 μm oxidation area. Since the diameter of the upper mesa 30 of the first VCSEL 100 is 40 μm. The portions on the first tuning layer 32 and the second tuning layer 33 are not oxidized, maintaining the original thickness and providing a first wavelength $\lambda_1$. The diameter of the upper mesa 30 of the second VCSEL 200 is 30 μm. The portion on the first tuning layer 32 is not oxidized. The second tuning layer 33 is completely oxidized. The refractive index and thickness are thus partially changed to provide a second wavelength $\lambda_2$. The diameter of the upper mesa 30 on the third VCSEL 300 is 20 μm. The portions on the first tuning layer 32 and the second tuning layer 33 are completely oxidized. The index of refraction and thickness are greatly changed, providing a third wavelength $\lambda_3$. This is how the invention utilizes the selective oxidation method to make devices with different resonant wavelengths in a single manufacturing process.

As the oxidation extent of each tuning layer can be accurately controlled, the disclosed manufacturing process has little errors and is highly stable. The wavelength variants among the devices are determined by the thickness and composition of the tuning layers before oxidation. The thickness and composition can be accurately controlled by epitaxial growth. For example, the wavelength of a λ/4 thick tuning layer after oxidation is changed to 8 nm, and that of a λ/16 thick tuning layer is 2 nm. Through the combination of different tuning layers, one can make many kinds of wavelength devices.

To further explain the relation between the number of wavelength configurations and the tuning layers, we make five resonant cavity devices on a substrate. The sizes of their upper mesas are 5 μm, 10 μm, 20 μm, 30 μm, and 40 μm, respectively. At the same time, there are four tuning layers Layer1~Layer4. The oxidation rates are 2 μm/hr, 5 μm/hr, 10 μm/hr, and 15 μm/hr, respectively. Table 1 shows the oxidation condition of the tuning layer in the respective upper mesas of different sizes after one hour of oxidation.

TABLE 1

| Size of the upper mesa (μm) | Layer1 (15 μm/hr) | Layer2 (10 μm/hr) | Layer3 (5 μm/hr) | Layer4 (2 um/hr) |
| --- | --- | --- | --- | --- |
| 40 | No | No | No | No |
| 30 | Yes | No | No | No |
| 20 | Yes | Yes | No | No |
| 10 | Yes | Yes | Yes | No |
| 5 | Yes | Yes | Yes | Yes |

As shown in Table 1, each upper mesa can give a wavelength. The total number of configurations is then the number of tuning layers plus one (i.e. $N_\lambda = N_t + 1$, where $N_t$ is the number of tuning layers and $N_\lambda$ is the number of wavelength configurations). Moreover, the change in thickness does not only change the resonant wavelength, but also the optical field distribution of the standing waves inside the resonant cavity. Using this property, the active region for different wavelengths can be grown at the place where the corresponding optical field intensity becomes the strongest. Therefore, devices of different wavelengths can be optimized in their designs.

The invention covers various kinds of resonant cavity device arrays for WDM, such as the resonant cavity photo detector (RCPD), the vertical-cavity surface emitting laser (VCSEL), and the resonant cavity light emitting diode (RCLED).

Since the invention uses the selective oxidation method, it does not only have precision control over wavelengths but also has a larger tolerance for the oxidation errors. Therefore, multiple-wavelength resonant cavity devices with desirable properties and lower costs can be made in a single process.

Certain variations would be apparent to those skilled in the art, which variations are considered within the spirit and scope of the claimed invention.

What is claimed is:

1. A resonant cavity device array for WDM application, comprising:
    a substrate;
    a plurality of oxidation-confined resonant cavity devices with different wavelengths formed on said substrate;
    each of the oxidation-confined resonant cavity devices having a selective oxidation structure;
    the selective oxidation structure containing a plurality of $Al_xGa_{1-x}As$ oxidation tuning layers for forming AlGaO during an oxidation process, thereby changing the refractive index and thickness of a partial area of the $Al_xGa_{1-x}As$ oxidation tuning layer;
    the resonant wavelength of each of the oxidation-confined resonant cavity devices having different oxidation extent in the $Al_xGa_{1-x}As$ oxidation tuning layer with some resonant cavity devices having tuning layers completely oxidized, some resonant cavity devices having tuning layers not completely oxidized and some resonant cavity devices having some tuning layers which are oxidized and some tuning layers which are not oxidized, the propagation constant being determined by the number of tuning layers which are completely oxidized.

2. The resonant cavity device array of claim 1, wherein the selective oxidation structure includes an upper mesa distinctive in size on each of the oxidation-confined resonant cavity device, the upper mesa containing a plurality of the $Al_xGa_{1-x}As$ oxidation tuning layers.

3. The resonant cavity device array of claim 1, wherein the wavelength variant of the oxidation-confined resonant cavity device is determined by the number of layers, thicknesses, and compositions of the $Al_xGa_{1-x}As$ oxidation tuning layer contained therein.

4. The resonant cavity device array of claim 1, wherein the substrate is a GaAs substrate.

5. A fabricating method of a resonant cavity device array for WDM application, the method comprising the steps of:
    providing a substrate;
    forming a plurality of oxidation-confined resonant cavity devices with a polycrystalline structure on one surface of the substrate, the polycrystalline structure of each of the oxidation-confined resonant cavity devices contains a selective oxidation structure with a plurality of $Al_xGa_{1-x}As$ oxidation tuning layers; and oxidizing the oxidation-confined resonant cavity devices so that AlGaAs in the $Al_xGa_{1-x}As$ oxidation tuning layer forms AlGaO after oxidation to change refractive index and thickness of part of the $Al_xGa_{1-x}As$ oxidation tuning layer;

wherein a resonant wavelength of each of the oxidation-confined resonant cavity devices has different oxidation extent of the $Al_xGa_{1-x}As$ oxidation tuning layers with some resonant cavity devices having tuning layers completely oxidized, some resonant cavity devices having tuning layers not completely oxidized and some resonant cavity devices having some tuning layers which are oxidized and some tuning layers which are not oxidized, the propagation constant being determined by the number of tuning layers which are completely oxidized.

6. The method of claim 5, wherein the selective oxidation structure includes an upper mesa distinctive in size on each of the oxidation-confined resonant cavity device, the upper mesa containing a plurality of the $Al_xGa_{1-x}As$ oxidation tuning layers.

7. The method of claim 5, wherein the wavelength variant of the oxidation-confined resonant cavity device is determined by the number of layers, thicknesses, and compositions of the $Al_xGa_{1-x}As$ oxidation tuning layer contained therein.

8. The method of claim 5, wherein the substrate is a GaAs substrate.

9. The method of claim 5, wherein the oxidation-confined resonant cavity device is selected from the group consisting of a resonant cavity photo detector (RCPD), a vertical-cavity surface emitting laser (VCSEL), and a resonant cavity light emitting diode (RCLED).

* * * * *